(12) United States Patent
Fitzi et al.

(10) Patent No.: US 9,735,336 B2
(45) Date of Patent: Aug. 15, 2017

(54) METHOD FOR SWITCHING AN ELECTRICAL LOAD IN A BRIDGE BRANCH OF A BRIDGE CIRCUIT, AND BRIDGE CIRCUIT

(75) Inventors: Andreas Fitzi, Staefa (CH); Stephan Dobretsberger, Graz (AT)

(73) Assignee: AMS AG, Unterpremstaetten (AT)

( * ) Notice: Subject to any disclaimer, the term of this patent is extended or adjusted under 35 U.S.C. 154(b) by 1273 days.

(21) Appl. No.: 13/089,406

(22) Filed: Apr. 19, 2011

(65) Prior Publication Data

US 2011/0309803 A1 Dec. 22, 2011

(30) Foreign Application Priority Data

Apr. 20, 2010 (DE) .......... 10 2010 015 660

(51) Int. Cl.
*H01L 41/00* (2013.01)
*H01L 41/04* (2006.01)

(52) U.S. Cl.
CPC .................. *H01L 41/042* (2013.01)

(58) Field of Classification Search
CPC .......... H02M 7/5387; H05B 41/2822
USPC ............ 320/166; 310/316.01, 317, 318; 363/132, 136
See application file for complete search history.

(56) References Cited

U.S. PATENT DOCUMENTS

| | | | |
|---|---|---|---|
| 5,138,217 A | | 8/1992 | Wada et al. |
| 5,428,522 A | * | 6/1995 | Millner .......... H02M 7/53871 363/63 |
| 5,642,018 A | * | 6/1997 | Marcotte ............ 315/169.4 |
| 6,016,052 A | * | 1/2000 | Vaughn .......... H01L 41/044 310/318 |
| 6,087,863 A | * | 7/2000 | Aflatouni ............ H05B 33/08 327/111 |
| 2002/0011762 A1 | | 1/2002 | Klenk et al. |
| 2002/0118555 A1 | * | 8/2002 | Lehuede .......... H02M 7/5387 363/62 |
| 2004/0251778 A1 | * | 12/2004 | Hoshino ............ H02N 2/025 310/317 |
| 2006/0055284 A1 | | 3/2006 | Hoshino et al. |
| 2009/0295455 A1 | * | 12/2009 | Goodchild .......... B06B 1/0253 327/424 |

(Continued)

FOREIGN PATENT DOCUMENTS

| | | |
|---|---|---|
| DE | 40 11 277 | 11/1990 |
| DE | 199 03 555 | 8/2000 |
| DE | 11 2007 002 621 | 9/2009 |

*Primary Examiner* — Richard Isla Rodas
*Assistant Examiner* — Johali Torres Ruiz
(74) *Attorney, Agent, or Firm* — McDermott Will & Emery LLP

(57) ABSTRACT

In one embodiment, a method for switching an electrical load having at least one capacitive component and one inductive component in a bridge branch of a bridge circuit comprises a charging of the bridge branch to a first voltage (V1) in a forward switching phase (F), a discharging of the capacitive component of the electrical load in a first open switching phase (O1), a charging of the bridge branch to a second voltage (V2) in a reverse switching phase (R), with the second voltage (V2) being polarized inversely from the first voltage (V1), and a negative charging of the capacitive component of the electrical load in a second open switching phase (O2). A bridge circuit is also provided.

18 Claims, 8 Drawing Sheets

(56) References Cited

U.S. PATENT DOCUMENTS

2010/0066204 A1\* 3/2010 Hayashi ................ H01L 41/044
310/318

\* cited by examiner

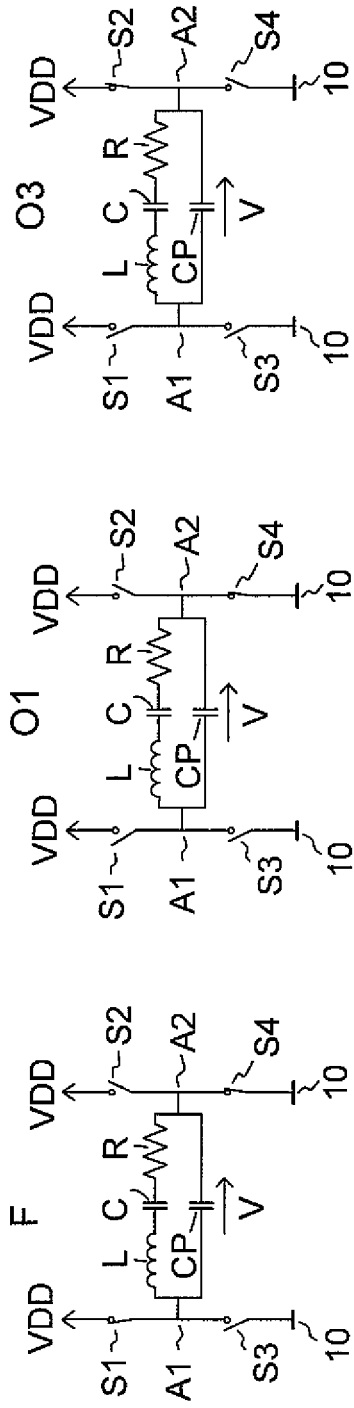
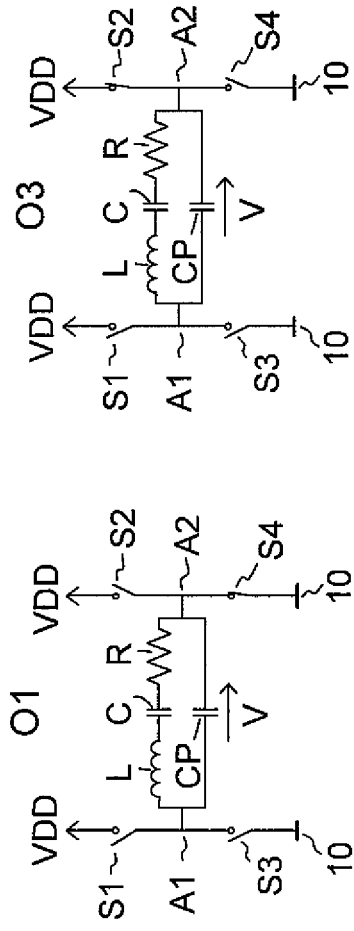
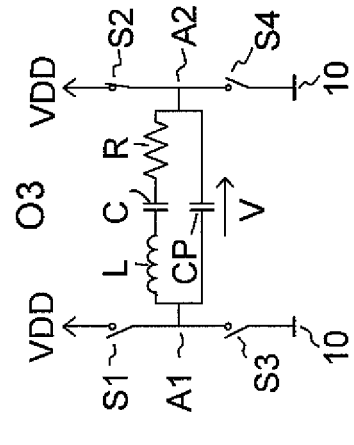
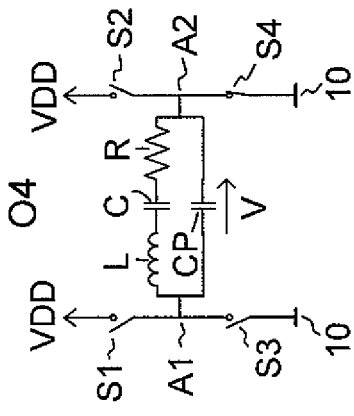
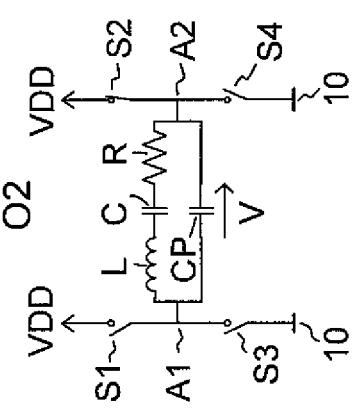
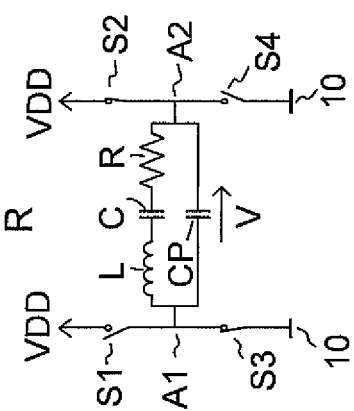

METHOD FOR SWITCHING AN ELECTRICAL LOAD IN A BRIDGE BRANCH OF A BRIDGE CIRCUIT, AND BRIDGE CIRCUIT

RELATED APPLICATIONS

This application claims the priority of German application no. 10 2010 015 660.4 filed Apr. 20, 2010

FIELD OF THE INVENTION

The present invention relates to a method for switching an electrical load in a bridge branch of a bridge circuit, and to a bridge circuit. The electrical load has at least one capacitive and one inductive component.

BACKGROUND OF THE INVENTION

A bridge circuit is usually used for operating an electrical load that has both an inductive and a capacitive component. The electrical load can be a piezo actuator, for example, and is operated with a voltage provided in the bridge branch. A piezo actuator has electrical and mechanical properties. The electrical component is represented in essence as a capacitor, a so-called parallel capacitor, while the mechanical component is depicted essentially as a series resonant circuit with a frequency-determining inductance. Such a piezo actuator is used, for example, to excite a loudspeaker membrane. Common driver circuits use so-called full bridges, which reach double the voltage amplitude of a half-bridge for the same supply voltage and, therefore, also roughly twice the amplitude of the mechanical movement generated by a connected piezo actuator.

Known driver circuits switch the bridge alternately in the forward and the reverse direction, with a voltage at the level of a positive supply voltage being provided in the bridge branch in the forward direction, and a voltage at the level of the negative supply voltage being provided in the bridge branch in the reverse direction. For this purpose it is necessary in each case to discharge the energy stored in the parallel capacitor, reverse the capacitor's polarity and recharge it. The power loss that occurs is roughly four times the product of the capacitance value of the parallel capacitor, the squared supply voltage and the switching frequency.

SUMMARY OF THE INVENTION

One object of the invention is to further reduce the power loss when operating or switching such an electrical load.

This and other objects are attained in accordance with one aspect of the present invention directed to a method for switching an electrical load having at least one capacitive component and at least one inductive component in a bridge branch of a bridge circuit. The method comprises the steps of:
  charging the bridge branch to a first voltage in a forward switching phase,
  discharging the capacitive component of the electrical load in a first open switching phase,
  charging the bridge branch to a second voltage in a reverse switching phase, the second voltage being polarized inversely to the first voltage, and
  negatively charging the capacitive component of the electrical load in a second open switching phase.

Due to a forced internal current flow in the bridge branch in the first and second open switching phases, the energy stored in the capacitive component of the electrical load is discharged or charged with the aid of the inductive component of the electrical load. The current flow is achieved by operating the bridge circuit in an open state, in which one terminal of the bridge branch is open. Therefore, the power loss in the first and the second open switching phases is approximately zero.

Thereby the introduced method makes it possible to further reduce the power loss during switching of the electrical load.

The bridge branch is also referred to as a bridge diagonal.

In one embodiment, the method has the following step after the first open switching phase and the second open switching phase:
  reversing the polarity and charging the capacitive component of the electrical load in a third open switching phase.

Consequently, in this embodiment, the following steps are passed through: forward switching phase, first open switching phase, third open switching phase, reverse switching phase, second open switching phase and fourth open switching phase. Due to the fact that there is again a transfer of energy between the capacitive component and the inductive component by a forced current flow inside the electrical load in the third open switching phase, the power loss in this open switching phase is also approximately zero.

The power loss in switching the electrical load is consequently further minimized.

In an alternative embodiment, the method has the following step after the first open switching phase and the second open switching phase:
  complete discharging of the capacitive component of the load by equalization of the potential in the bridge branch in an intermediate switching phase.

Thus, in this embodiment, the following steps are passed through: forward switching phase, first open switching phase, intermediate switching phase, reverse switching phase, second open switching phase and intermediate switching phase.

The intermediate switching phase is performed for the case in which the capacitive component of the electrical load is so large that the energy stored in it cannot be completely charged or discharged by the inductive component of the electrical load in the first or second open switching phase. By switching the bridge branch actively to the identical potential on both sides, the remaining energy still stored in the capacitive component of the electrical load is completely discharged. A further reduction of the power loss is also achieved with this measure.

In one refinement, a changeover to the first open switching phase as well as a changeover to the second open switching phase take place depending on a higher-level clock signal.

A square-wave signal may be used as the clock signal, for example. In a transition of this clock signal from zero to one, the first open switching phase is activated, for example, whereas the second open switching phase is activated in case of a transition from one to zero. The higher-level clock signal is provided, for example, by a circuit in which the method is used.

The length of the respective switching phases is preferably adapted to a ratio between the inductive component and the capacitive component of the electrical load.

In another embodiment, there is a changeover to the'reverse switching phase if an actual value of a voltage in the bridge branch has reached the value of the second voltage, or if a first derivative of the voltage in the bridge branch has reached the value zero.

The voltage in the bridge branch is used for operating or switching the electrical load in the bridge branch. Thus there is a changeover to the reverse switching phase as soon as this voltage has reached the value of the second voltage, or as soon as the value of the voltage no longer changes, i.e., its first derivative has reached the value zero.

The voltage in the bridge branch is also referred to as a diagonal voltage or a bridge voltage.

In a refinement, there is a changeover to the forward switching phase if the actual value of the voltage in the bridge branch has reached the value of the first voltage, or if the first derivative of the voltage in the bridge branch has reached the value zero.

In another embodiment, there is a changeover to the third and fourth open switching phases if the actual value of the voltage in the bridge branch has reached zero.

In a refinement, there is a changeover to the intermediate switching phase if the first derivative of the voltage in the bridge branch has reached the value zero.

In another embodiment, the capacitive component of the electrical load is discharged and negatively charged with the aid of the energy of the inductive component of the load.

This has the effect that the power loss in the associated switching phases is approximately equal to zero. Thereby the power loss is markedly reduced overall.

In a refinement, the forward switching phase, the first open switching phase, the reverse switching phase and the second open switching phase are each repeated cyclically.

Another aspect of the invention is directed to a bridge circuit for switching an electrical load having at least one capacitive and at least one inductive load in the bridge branch. The bridge circuit comprises:
- a first switch for feeding a supply voltage to a first terminal of the bridge branch,
- a second switch for feeding the supply voltage to a second terminal of the bridge branch,
- a third switch for connecting the first terminal of the bridge branch to a reference potential terminal,
- a fourth switch for connecting the second terminal of the bridge branch to the reference potential terminal, and
- a control unit for controlling the switches in a switching sequence with at least one switching state in which at most one switch from a set comprising the first, second, third and fourth switches is closed.

The control unit drives the switches in the switching sequence with several switching states. The capacitive component of the electrical load is charged or discharged with the voltage in the bridge branch. By virtue of the fact that, in at least one switching state, at most one of the four switches is closed, an internal equalization current is forcibly created inside the electrical load that effects a transfer of energy between the capacitive and the inductive component of the electrical load. The power loss in the bridge circuit when switching the electrical load is consequently further minimized.

The control unit realizes a state machine. In particular, the control unit is set up to control the switches of the bridge circuit in accordance with the above method. A switching state consequently represents a position of the switches in a respective switching phase. The control unit is preferably implemented with digital technology.

The capacitive component of the electrical load is preferably connected in parallel to the inductive component of the electrical load. The capacitive component of the electrical load is referred to as a parallel capacitor, for example. In particular, a resistor as well as an additional capacitor are connected in series to the inductive component of the electrical load. Thereby a series resonant circuit comprising a frequency-determining inductor, a capacitor and a resistor results for the inductive component of the electrical load. This series resonant circuit is connected in parallel to the parallel capacitor. The parallel capacitance is considerably larger than the capacitance of the series resonant circuit. Consequently a series resonant frequency and a parallel resonant frequency result for the electrical load. The bridge circuit is preferably operated in the range of the series resonant frequency at which the mechanical stroke of the piezo actuator is largest. The series resonant frequency thus determines a time period for each of the individual switching states.

The supply voltage is also referred to as the bridge supply voltage.

In another embodiment, the bridge circuit comprises a sensing element that is connected between the first terminal and the second terminal of the bridge branch. The sensing element is designed to detect the actual value of the voltage in the bridge branch.

In a refinement, the bridge circuit comprises a first sensor and a second sensor. The first sensor is connected to the first switch or to the third switch, and is designed to detect an actual value of a first current through the first or the third switch. The second sensor is connected to the second switch or to the fourth switch, and is designed to detect an actual value of a second current through the second or the fourth switch.

Alternatively to measuring voltage with the sensing element in the bridge branch, a current can be measured in the first and in the second terminal. The current is measured in respectively opposing switches. Thus, e.g., the discharge current through the first and the second switches is detected; alternatively, the current through the third and the fourth switch is detected. The detection of voltage or current is the prerequisite for the changeover between the various switching states.

In another embodiment, in a forward switching phase, the first and the fourth switches are closed and the second and third switches are each opened.

Thereby the supply voltage is fed to the first terminal, while the second terminal is at reference potential. The positive supply voltage is provided in the bridge branch.

In a refinement, in a reverse switching phase, the first and the fourth switches are opened and the second and third switches are closed.

Thereby the first terminal is at reference potential, while the second terminal is connected to the supply voltage. The negative supply voltage is provided in the bridge branch.

In another embodiment, at most one switch from the set comprising the first, second, third and fourth switches is closed in a first, a second, a third and a fourth open switching phase.

That is to say, of the four switches, a maximum of one switch is closed in each open switching phase. Thereby either the first or the second terminal is at reference potential or at the potential of the supply voltage. The respective other terminal is open. Consequently an internal current flow is forced in the electrical load, whereby the energy stored in the capacitive component of the electrical load is discharged or charged with the aid of the energy from the inductive component of the electrical load. This advantageously takes place without losses.

In a refinement, a potential of the first terminal of the bridge branch is matched in an intermediate switching phase to a potential of the second bridge branch terminal.

In the intermediate switching phase, either the first and second terminals are connected to the reference potential terminal, or the first and second terminals are connected to the supply voltage. Thereby no current flows in the bridge branch and losses are minimized.

In another embodiment, both a final value of the first voltage and a final value of the second voltage are matched in magnitude to the supply voltage.

A final value of the first voltage is matched to the supply voltage. A final value of the second voltage is matched to the negative value of the supply voltage, i.e., the reverse-polarized supply voltage.

In a refinement, the bridge circuit is set up to operate a piezo actuator with the voltage in the bridge branch, the electrical load comprising the piezo actuator.

The piezo actuator is simulated by means of the electrical load having a parallel connection of the frequency-determining capacitive component and the frequency-determining inductive component. The parallel circuit comprising the series resonant circuit and the parallel capacitor forms an equivalent circuit of the piezo actuator. Thereby the piezo actuator can advantageously be driven with minimum losses. The driving of the piezo actuator takes into account both its mechanical and its electrical properties. Depending on the ratio between the inductive component and the capacitive component of the electrical load, the piezo actuator is driven with a corresponding series resonance frequency and a temporally matched sequence of switching states or switching phases. The losses that usually result from the recharging of the capacitive component are minimized. Only the losses resulting from the non-ideal switches remain.

The switches are implemented, for example, as transistors with CMOS technology or as bipolar transistors. They can each be implemented as a switch or as a current source.

BRIEF DESCRIPTION OF THE DRAWINGS

The invention will be described in detail below for several embodiments with reference to the figures. Components and circuit elements that are functionally identical or have the identical effect bear identical reference numbers. Therein:

FIGS. 2A to 2F show an exemplary embodiment of a method according to the invention;

DETAILED DESCRIPTION OF THE DRAWINGS

Figure 1:
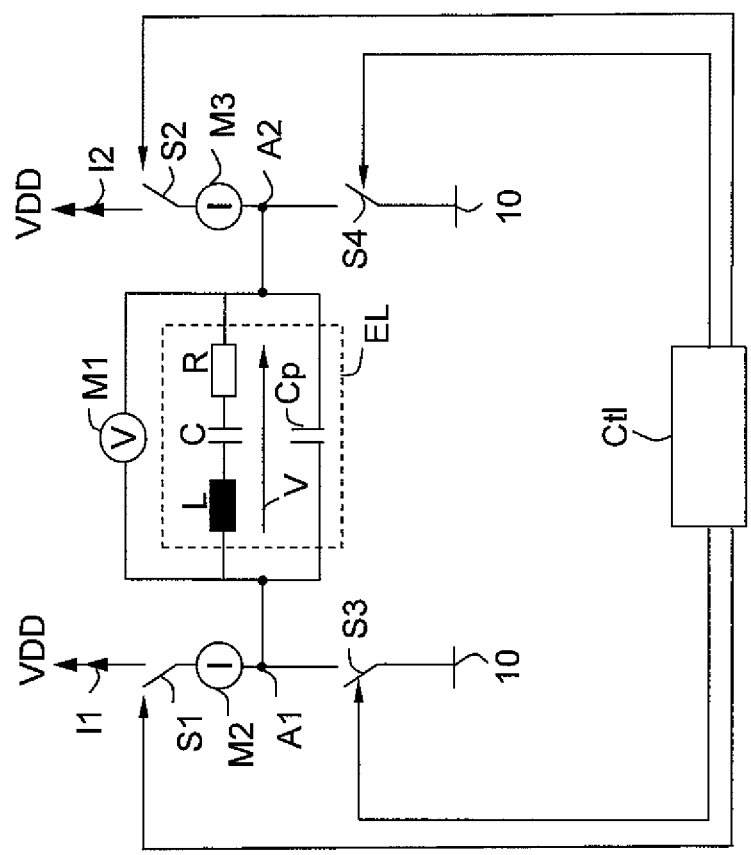
FIG. 1 shows an exemplary embodiment of a bridge circuit according to the invention.

FIG. 1 shows an embodiment of a bridge circuit according to the invention. The bridge circuit comprises a first switch S1, a second switch S2, a third switch S3, a fourth switch S4 and a control unit Ctl. The first switch S1 couples a terminal for the supply voltage VDD to a first terminal A1 of the bridge circuit. The second switch S2 is connected between the terminal for the supply voltage VDD and a second terminal A2 of the bridge circuit. The third switch S3 is connected between the first terminal A1 of the bridge circuit and a reference potential terminal 10. The fourth switch S4 is connected between the second terminal A2 of the bridge circuit and the reference potential terminal 10. As pairs, the first and the third switches S1, S3, as well as the second and the fourth switches S2, S4, form a respective voltage divider that is connected to the supply voltage VDD. The bridge circuit is therefore implemented as a full bridge circuit. A bridge branch is formed between the first terminal A1 and the second terminal A2. The control unit Ctl is connected to the first, the second, the third and the fourth switches S1, S2, S3, S4 in order to control each of them.

The bridge circuit further comprises a sensing element M1 that is connected between the first and the second terminals A1, A2 of the bridge circuit. The sensing element M1 is designed to detect the actual value of the voltage in the bridge branch.

In addition, a first sensor M2 and a second sensor M3 are provided. The first sensor M2 is connected between the first switch S1 and the first terminal A1, for example, and is designed to detect an actual value of a first current I1 through the first switch S1. The second sensor M3 is connected between the second switch S2 and the second terminal A2, for example, and is designed to detect an actual value of a second current I2 through the second switch S2.

Accordingly, either a voltage V in the bridge branch, or a current through the opposing switches S1 and S2, is detected. The voltage V drops between the first and the second terminals A1, A2 and is directed from the first terminal A1 to the second terminal A2.

An electrical load EL that is connected to or operated by the bridge circuit is also shown. The electrical load EL comprises at least one capacitive and one inductive component. The capacitive component is represented here for the sake of example by a parallel capacitor CP, and the inductive component as an inductor L. In detail, the inductive component of the electrical load EL is formed by a series resonator comprising the inductor L, another capacitor C and a resistor R. The parallel capacitor CP and the series resonator are connected in parallel between the first terminal A1 and the second terminal A2, and are operated with the voltage V in the bridge branch. The electrical load EL forms the equivalent circuit diagram of a piezo actuator, for example. In this case, the parallel capacitor CP represents the electrical properties of the piezo actuator, while the series resonator represents the mechanical properties of the piezo actuator.

The control unit Ctl comprises a state machine based on a state transition diagram that realizes a switching sequence for driving the switches S1-S4.

The functioning of the bridge circuit will be explained with reference to FIGS. 2 and 5.

FIGS. 2A to 2F show an exemplary embodiment of a method according to the invention. Different switching states in individual switching phases that form a switching sequence which is passed through from left to right are shown one alongside the other. The illustrated switching sequence forms the basis for the temporal driving of the switches S1-S4 of the bridge circuit from FIG. 1 by the control unit Ctl.

In a forward switching phase F, FIG. 2A shows that the first and the fourth switches S1, S4 are closed, while the second and third switches S2, S3 are opened. The bridge branch is charged to a first voltage V1. The first voltage V1 corresponds in level to the supply voltage VDD.

In a subsequent first open switching phase O1, which is initiated by a rising edge of the higher-level clock signal, FIG. 2B shows that the first switch S1 is opened, so that only the fourth switch S4 remains closed. A current flow through the series resonator and thus through the inductor L discharges the energy stored in the parallel capacitor CP. This advantageously takes place without losses.

As soon as a voltage V in the bridge branch has reached the value zero, there is a changeover into a third open switching phase O3. FIG. 2C shows that the fourth switch S4 is opened and the second switch S2 is simultaneously closed. Thereby the second terminal A2 is drawn to the potential of the supply voltage VDD. The polarity of the parallel capacitor CP is reversed and it is charged to the value of a second voltage V2. The second voltage V2 corresponds in magnitude to the supply voltage VDD, but is polarized inversely. It is also referred to here as a negative supply voltage.

As soon as the actual value of the voltage V in the bridge branch has reached the value of the negative supply voltage VDD, there is a changeover to a reverse switching phase R. In this switching phase, as shown in FIG. 2D, the second and the third switches S2, S3 are closed, whereas the first and fourth switches S1, S4 are opened. In the reverse switching phase R, the flow of current through the inductor L reverses direction. The negative supply voltage is provided in the bridge branch.

Controlled by a falling edge of the higher-order clock signal, there is another changeover to a second open switching phase O2. As shown in FIG. 2E, the third switch S3 is opened, so that only the second switch S2 remains closed. The parallel capacitor CP is charged negatively.

As soon as the voltage V in the bridge branch has reached the value zero, there is a changeover into the fourth open switching phase O4. The polarity of the parallel capacitor CP is again reversed, and it is again charged positively. As shown in FIG. 2F, the fourth switch S4 is closed for this purpose; all other switches are opened. As soon as the voltage V in the bridge branch has reached the value of the positive supply voltage VDD, there is a changeover to the forward switching phase F and the switching phases as described are passed though again.

The energy stored in the series resonator discharges or charges the parallel capacitor CP in the open switching phases O1, O2, O3 and O4. The bridge circuit is operated in the range of the series resonance frequency of the series resonator. The higher-order clock signal is selected in such a manner that the bridge voltage V at the beginning of the forward or reverse switching phase F, R corresponds in magnitude to the supply voltage VDD. The fact that the first and third open switching phases O1 and O3 are passed through between the forward switching phase F and the reverse switching phase R, and the second and fourth open switching phases O2 and O4 are passed through between the reverse switching phase R and the forward switching phase F, assures that a potential of the respective open terminal A1 or A2 does not fall below the reference potential or exceed the potential of the supply voltage VDD. This has the advantageous effect that the parallel capacitor CP, which has a considerable capacitance value, is charged and discharged without losses. The temporal behavior is adapted to the resonant frequency of the series resonator, as well as to the magnitude of the parallel capacitance CP.

Figure 3:
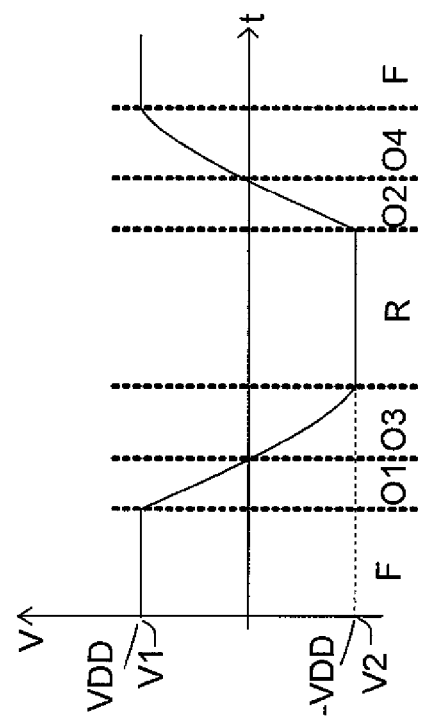
FIG. 3 shows an example of a voltage curve in the bridge branch for the embodiment of FIGS. 2A to 2F.

FIG. 3 shows an example of a voltage curve in the bridge branch for the embodiment of FIG. 2. In the forward switching phase F, the bridge voltage V has the value of a first voltage V1, which is matched in level to the value of the supply voltage VDD. In the first open switching phase O1, the bridge voltage V falls to the value zero. In the third open switching phase O3, the bridge voltage V takes on the value of a second voltage V2 that is matched in magnitude to the supply voltage VDD, but is polarized inversely to the first voltage V1. This value is retained during the reverse switching phase R. In the second open switching phase O2, the value of the bridge voltage V rises again to zero volts. In the fourth open switching phase O4, the value of the bridge voltage V rises to the value of the supply voltage VDD.

Figure 4A:
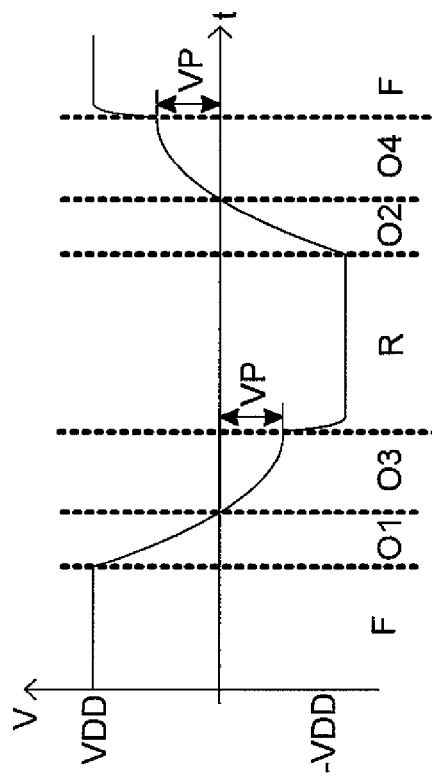
FIG. 4A shows another example of a voltage curve in the bridge branch for the embodiment of FIGS. 2A to 2F.

FIG. 4A shows another example of a bridge voltage curve for the embodiment of FIG. 2. Unlike the curve in FIG. 3, this curve is based on a much larger parallel capacitance in the bridge branch. This has the result that, unlike FIG. 3, the parallel capacitor CP can be charged in the third open switching phase O3 only to a residual voltage VP after polarity reversal. In this case, the ratio of the energy storable in the series resonator to the energy that can be stored in the parallel capacitor CP is such that the energy of the series resonator is not sufficient to charge the parallel capacitor CP in the open switching phases O1, O3 and O2, O3 completely to the magnitude of the supply voltage VDD, i.e., to recharge it by twice the amount of the supply voltage VDD. Consequently there is a changeover from the third open switching phase O3 to the reverse switching phase R or the forward switching phase F whenever the first derivative of the bridge voltage V takes on the value zero. In the reverse switching phase R, or the forward switching phase F, the difference of magnitude between the residual voltage VP and the supply voltage VDD is charged onto the parallel capacitor CP, so that the absolute value of the supply voltage VDD is provided in the bridge branch.

Figure 4B:
FIG. 4B shows an example of a power loss curve for FIG. 4A.

FIG. 4B shows an example of a power loss curve for FIG. 4A. The power loss P is plotted here versus the time t, the individual contributions to the power consumption being shown as shaded triangles. It is clearly visible that losses occur due to the residual voltage VP in the reverse switching phase R, and due to the residual charging of the parallel capacitor CP in the forward switching phase F.

These losses are calculated according to the following formula:

$$P = C \cdot (VDD - VP)^2 \cdot f$$

Here P represents the value of the power loss P, C the capacitance of the parallel capacitor CP, VDD the value of the supply voltage VDD, VP the value of the residual voltage VP and f the frequency of the higher-level clock signal.

No losses occur during the open switching phases O1, O2, O3, O4. In comparison to the known driver circuits and methods described in the opening part above, the power loss here is cut in half.

FIGS. 5A to 5F show another embodiment example of a method according to the invention. The sequence of individual switching phases or states is shown in temporal sequence from left to right. The bridge circuit from FIG. 1 is again the basis for the method. In comparison to the embodiment of the method in FIGS. 2A to 2F, an intermediate switching phase B is passed through here instead of the third open switching phases O3 and O4.

Figure 5A:
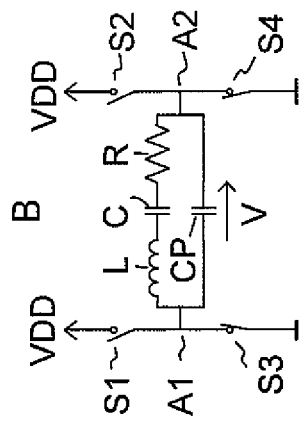
FIGS. 5A to 5F show another embodiment of a method according to the invention.
Figure 5B:
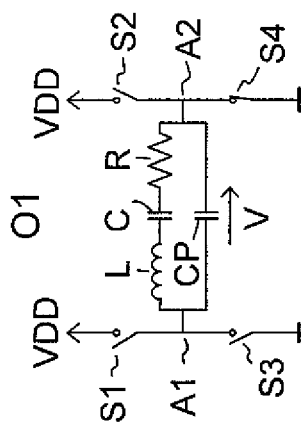
Figure 5C:
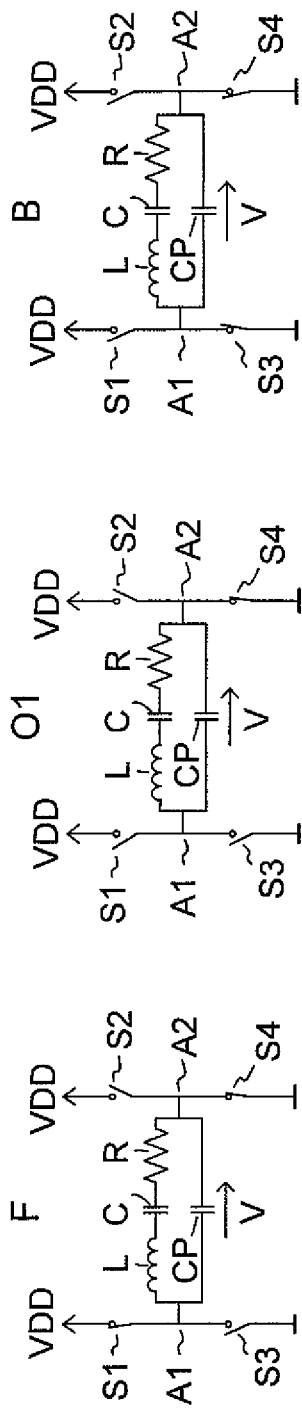
Figure 5D:
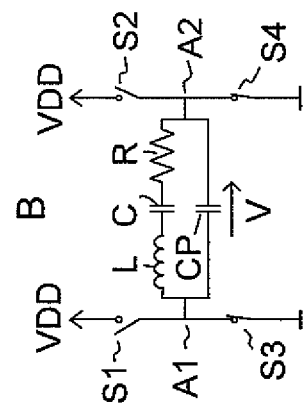
Figure 5E:
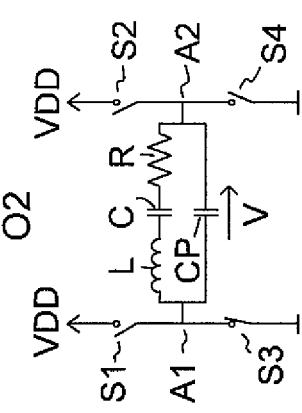
Figure 5F:
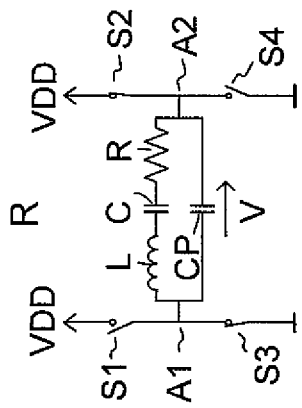

In the intermediate switching phase B, as shown in FIG. 5C, the switches S1 and S2 are opened, while the switches S3 and S4 are closed. Thereby the potential of the first and second terminals A1, A2 is drawn to the potential of the reference potential terminal 10. This embodiment of the method is particularly suitable for an electrical load in which the capacitive component represented by the parallel capacitor CP is much larger than the inductive component. The energy that can be stored in the series resonator of the electrical load is not sufficient in this case to recharge the parallel capacitor CP to an opposite polarity. The parallel capacitor CP is discharged by an amount that is less than the magnitude of the supply voltage VDD. In the intermediate switching phase B, the voltage V in the bridge branch is consequently drawn to the value zero. In this embodiment, therefore, the forward switching phase F, the first open switching phase O1, the intermediate switching phase B, the reverse switching phase R, the second open switching phase O2 and the intermediate switching phase B are passed through cyclically.

Figures 6A, 6B:
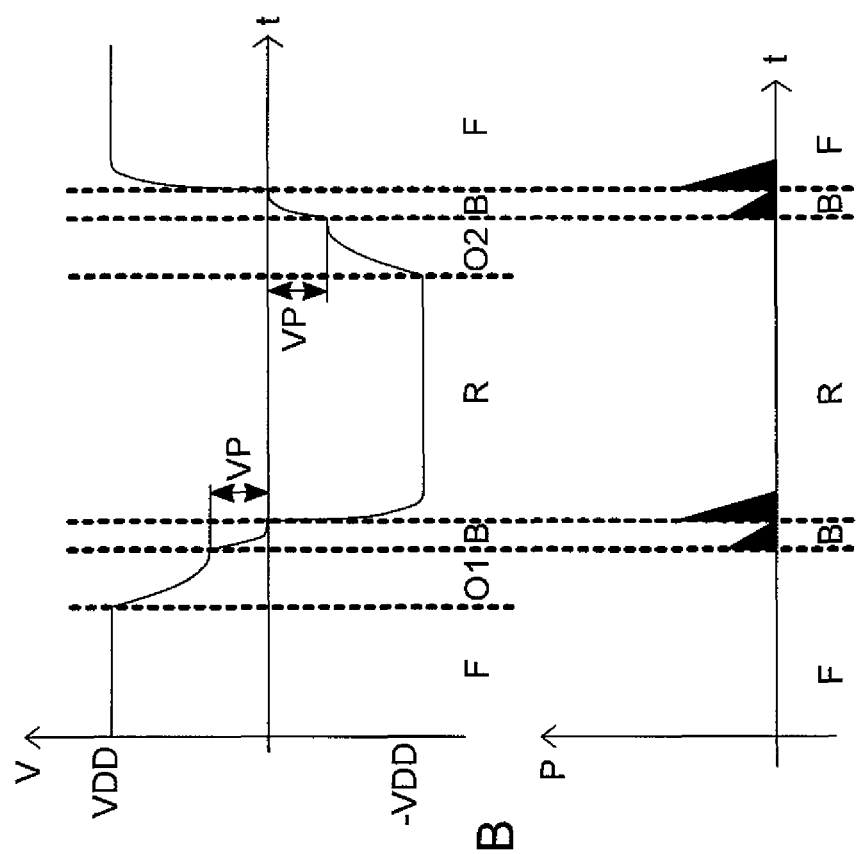
FIG. 6A shows an example of a voltage curve in the bridge branch for the embodiment of FIGS. 5A to 5F.
FIG. 6B shows an example of a power loss curve for FIG. 6A.

FIG. 6A shows an example of a voltage curve in the bridge branch for the embodiment of FIGS. 5A to 5F. It is recognizable here that, unlike the curve in FIG. 4A, discharging in the first open switching phase O1 is possible only up to a residual magnitude of the residual voltage VP. In the subsequent intermediate switching phase B, the bridge voltage V is drawn to zero. Similarly, the voltage V in the bridge branch can be discharged in the second open switching phase O2 only to the residual voltage VP. The discharging to the value zero volts takes place in the subsequent intermediate switching phase B.

FIG. 6B shows an example of a power loss curve for FIG. 6A. The individual contributions to the power consumption are each again represented by shaded triangles. It is recognizable that losses appear in the intermediate switching phase B as well as in the reverse switching phase R and the forward switching phase F. They are calculated according to the above-cited formula. It again becomes clear that the power loss is cut in half in comparison to conventional solutions.

FIGS. 7A to 7E show exemplary embodiments of a bridge circuit according to the invention in an open switching phase. For ideal switches, the illustrated alternative switching states can be used for the first, second or third open switching phases O1, O2, O3, O4 from the embodiments of FIGS. 2A to 2F and FIGS. 5A to 5F. All open switching phases O1, O2, O3, O4 are based on the principle that at most one of the four switches S1-S4 is closed. In each case, this forces an internal current flow inside the electrical load with the above-described advantageous effect of a reduced power loss.

Figure 7C:
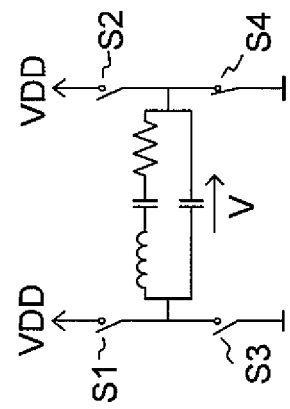
FIGS. 7A to 7E show exemplary embodiments of a bridge circuit according to the invention in the open switching phase.
Figure 7B:
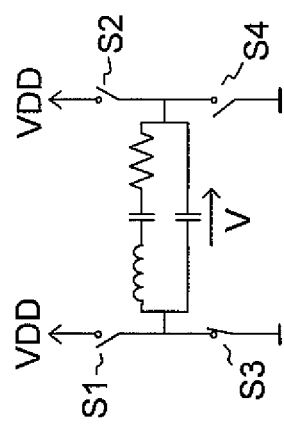
Figure 7E:
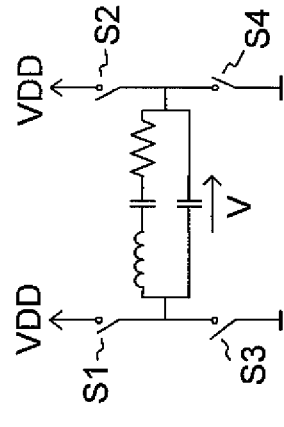
Figure 7A:
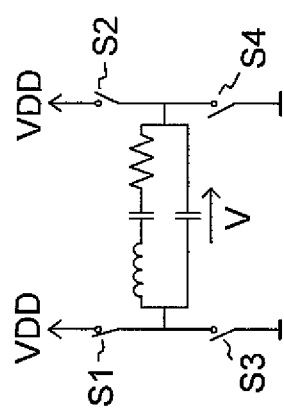
Figure 7D:
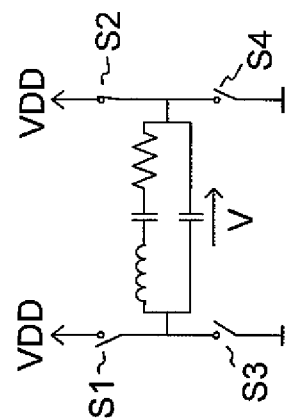

All four switches S1 to S4 are open in the embodiment illustrated in FIG. 7E.

For an implementation of the switches S1 to S4 as transistors in CMOS technology, for example, maintaining the switching sequence shown in FIGS. 2A to 2F or 5A to 5F is advantageous.

Figure 8A:
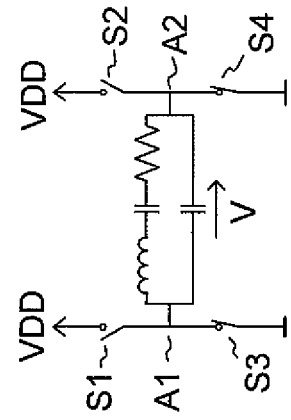
FIGS. 8A and 8B show exemplary embodiments of a bridge circuit according to the invention in the intermediate switching phase.

FIGS. 8A and B each show an exemplary embodiment of a bridge circuit according to the invention in the intermediate switching phase. In FIG. 8A, the switches S1 and S2 are closed, while the switches S3 and S4 are opened. Thereby the first and second terminals A1 and A2 are drawn to the potential of the supply voltage VDD. The voltage V in the bridge branch goes to zero.

Figure 8B:
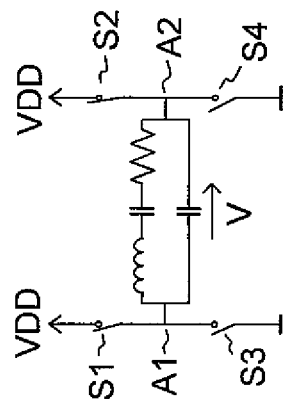

In the embodiment of FIG. 8B, the switches S1 and S2 are opened, while the switches S3 and S4 are closed. Thereby the first and second terminals A1, A2 are drawn to the potential of the reference voltage terminal 10. The voltage V in the bridge branch goes to zero.

Figure 9:
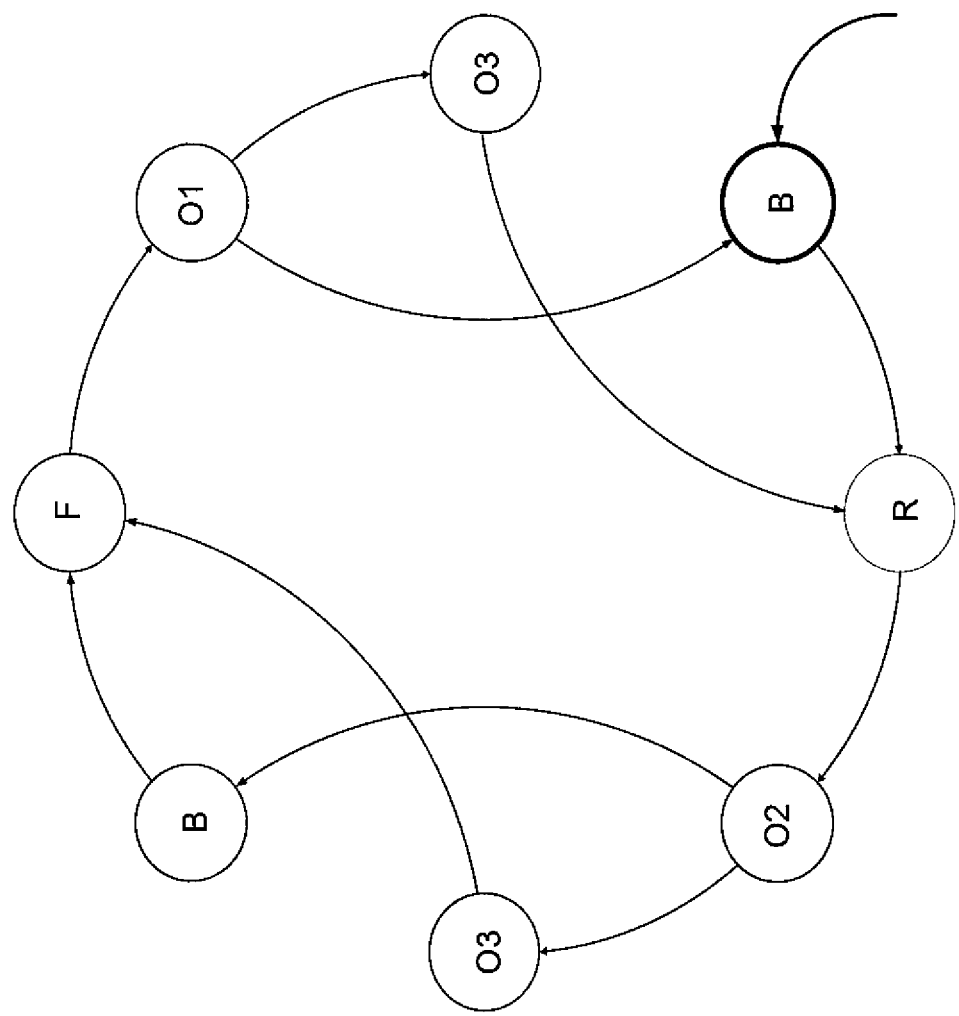
FIG. 9 shows an example of a state transition diagram.

FIG. 9 shows an example of a state transition diagram for the control unit Ctl. The bridge circuit from FIG. 1 is the basis here as well.

The beginning is the forward switching phase F for the sake of example. The first open switching phase O1 is switched on by a rising edge of the higher-level clock signal, for example. In this switching phase, the control unit Ctl, by measuring the bridge voltage V using the sensing element M1 for example, checks whether the bridge voltage V has reached the value zero, or whether the first derivative of the voltage V has reached the value zero, i.e., whether a connected piezo actuator is not being further discharged. In the first case, i.e., if the voltage V in the bridge circuit has reached the value zero, the parallel capacitor CP was discharged with the aid of the energy of the series resonator. Then the third open switching phase O3 is passed through. After the polarity of the parallel capacitor CP has been reversed and it has again been completely charged, there is a changeover to the reverse switching phase R.

In the other case, i.e., if the first derivative of the voltage V has reached the value zero in the open switching phase O1, the parallel capacitor CP was not completely discharged. Then the intermediate switching phase B is passed through. As soon as the voltage V has reached the value zero, there is a changeover into the reverse switching phase R.

There is a changeover, by means of a falling edge of the higher-order clock signal, for example, from the reverse switching phase R into the second open switching phase O2. Here the control unit Ctl checks whether it was possible to completely discharge the connected piezo actuator using the energy of the series resonator. This is the case if the voltage V in the bridge branch reaches the value zero. Then there is a changeover to the fourth open switching phase O4. Otherwise, i.e., if the piezo actuator is not being further discharged, which is determined by a zero-crossing of the first derivative of the voltage V, there is a changeover to the intermediate switching phase B.

Then there is a changeover from the intermediate switching phase B or the fourth open switching phase O4 to the forward switching phase F.

Advantageously, the actual ratio between the energy storable in the series resonator and the energy storable in the parallel capacitor CP is taken into account in each case. The respectively suitable switching sequence is accordingly passed through.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A method for switching an electrical load having at least one capacitive component and at least one inductive component in a bridge branch of a bridge circuit, the method comprising:
    charging the bridge branch to a first voltage in a forward switching phase;
    discharging, in a first open switching phase, energy stored in the capacitive component of the electrical load using energy from the at least one inductive component of the electrical load, wherein the discharging is effected by an internal current flow forced within the bridge branch, and wherein one terminal of the bridge branch is open during the first open switching phase such;

charging the bridge branch to a second voltage in a reverse switching phase, with the second voltage being polarized inversely to the first voltage; and negative charging, in a second open switching phase, energy of the capacitive component of the electrical load using energy from the at least one inductive component of the electrical load, wherein the negative charging is effected by the internal current flow forced within the bridge branch, wherein one terminal of the bridge branch is open during the second open switching phase, and wherein the electrical load in the bridge branch has a series resonant circuit with a capacitor connected in parallel which represent an equivalent circuit of a piezo actuator, the series resonant circuit representing mechanical properties of the piezo actuator, and the capacitor representing electrical properties of the piezo actuator.

2. The method according to claim 1, further comprising, after the first open switching phase and after the second open switching phase, reversing the polarity and charging the capacitive component of the electrical load in a third open switching phase.

3. The method according to claim 2, wherein there is a changeover to the third open switching phase if the actual value of the voltage in the bridge branch has reached the value zero.

4. The method according to claim 1, further comprising, after the first open switching phase and after the second open switching phase, complete discharging of the capacitive component of the electrical load by equalization of the potential in the bridge branch in an intermediate switching phase.

5. The method according to claim 4, wherein there is a changeover to the intermediate switching phase if the first derivative of the voltage in the bridge branch has reached the value zero.

6. The method according to claim 1, wherein there is a changeover into the first open switching phase and a changeover into the second open switching phase depending in each case on a higher-level clock signal.

7. The method according to claim 1, wherein there is a changeover to the reverse switching phase if an actual value of a voltage in the bridge branch has reached the value of the second voltage, or if a first derivative of the voltage in the bridge branch has reached the value zero.

8. The method according to claim 1, wherein there is a changeover to the forward switching phase if the actual value of the voltage in the bridge branch has reached the value of the first voltage, or if the first derivative of the voltage in the bridge branch has reached the value zero.

9. The method according to claim 1, wherein the forward switching phase, the first open switching phase, the reverse switching phase and the second open switching phase are repeated cyclically.

10. A bridge circuit for switching an electrical load in a bridge branch having at least one capacitive component and at least one inductive component, wherein the bridge circuit comprises:

a first switch for feeding a supply voltage to a first terminal of the bridge branch;

a second switch for feeding the supply voltage to a second terminal of the bridge branch;

a third switch for connecting the first terminal of the bridge branch to a reference potential terminal;

a fourth switch for connecting the second terminal of the bridge branch to the reference potential terminal; and a control unit for controlling the first, second, third and fourth switches in a switching sequence with at least one switching state in which at most one switch from a set comprising the first, second, third and fourth switches is closed, such that one of the first or second terminal of the bridge branch is open, wherein in the at least one switching state in which at most one switch from the set comprising the first, second, third and fourth switches is closed, an internal current flow is forced within the electrical load, such that energy stored in the at least one capacitive component of the electrical load is discharged or charged using energy from the at least one inductive component of the electrical load, and wherein the electrical load in the bridge branch has a series resonant circuit with a capacitor connected in parallel which represent an equivalent circuit of a piezo actuator, the series resonant circuit representing mechanical properties of the piezo actuator, and the capacitor representing electrical properties of the piezo actuator.

11. The bridge circuit according to claim 10, further comprising a sensing element that is inserted between the first terminal and the second terminal of the bridge branch, the sensing element being designed to detect the actual voltage value between the first and second terminals.

12. The bridge circuit according to claim 10, further comprising:

a first sensor that is connected to the first switch or to the third switch and is configured to detect an actual value of a first current through the first or the third switch; and a second sensor that is connected to the second switch or to the fourth switch and is configured to detect an actual value of a second current through the second or the fourth switch.

13. The bridge circuit according to claim 10, wherein in a forward switching phase, the first and the fourth switches are closed and the second and third switches are opened.

14. The bridge circuit according to claim 10, wherein in a reverse switching phase, the first and the fourth switches are opened and the second and third switches are closed.

15. The bridge circuit according to claim 10, wherein, in a first, a second, a third and a fourth open switching phase, at most one switch from the set comprising the first, second, third and fourth switches is closed.

16. The bridge circuit according to claim 10, wherein a potential of the first terminal of the bridge branch is matched in an intermediate switching phase to a potential of the second terminal of the bridge branch.

17. The bridge circuit according to claim 10, wherein a final value of the first voltage and a final value of the second voltage are matched in their respective magnitudes to the supply voltage.

18. The bridge circuit according to claim 10, that is set up to operate a piezo actuator with the voltage in the bridge branch, wherein the electrical load comprises the piezo actuator.

* * * * *